United States Patent
Neng et al.

(10) Patent No.: US 8,180,308 B1
(45) Date of Patent: May 15, 2012

(54) APPARATUS AND METHODS FOR DETECTION OF INTERFACE IN RADIO-FREQUENCY DEVICES

(75) Inventors: Sek Kin Neng, San Jose, CA (US);
Yungping Hsu, Saratoga, CA (US);
Tsunglun Yu, Cupertino, CA (US);
Ming Ta Lin, San Jose, CA (US);
Naveen-Kumar Arani, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 593 days.

(21) Appl. No.: 12/372,858

(22) Filed: Feb. 18, 2009

Related U.S. Application Data (60) Provisional application No. 61/060,303, filed on Jun. 10, 2008.

(51) Int. Cl.
*H04B 17/00* (2006.01)

(52) U.S. Cl. .............. 455/226.2; 455/232.1; 455/251.1

(58) Field of Classification Search .............. 455/226.2, 455/232.1, 251.1
See application file for complete search history.

(56) References Cited

U.S. PATENT DOCUMENTS

| | | | | |
|---|---|---|---|---|
| 6,785,523 | B2 * | 8/2004 | Husted et al. | 455/219 |
| 7,426,376 | B2 * | 9/2008 | Srinivasan et al. | 455/252.1 |
| 7,522,885 | B2 * | 4/2009 | Parssinen et al. | 455/67.11 |
| 7,565,124 | B2 * | 7/2009 | Lee et al. | 455/234.1 |
| 7,639,998 | B1 * | 12/2009 | Halvorson | 455/251.1 |
| 7,962,112 | B2 * | 6/2011 | Sandner et al. | 455/241.1 |
| 2004/0235439 | A1 * | 11/2004 | Husted et al. | 455/136 |
| 2007/0129034 | A1 * | 6/2007 | Adams et al. | 455/138 |
| 2010/0173599 | A1 * | 7/2010 | Solum | 455/232.1 |

* cited by examiner

Primary Examiner — Quan Tra (57) ABSTRACT

A communication apparatus includes a radio frequency (RF) apparatus. The RF apparatus includes an amplifier, and a signal detection circuit. The amplifier receives RF signals and amplifies those signals. The amplifier has an adjustable gain value. The signal detection circuit detects whether a received signal is an out-of-band radar signal depending on the gain value of the amplifier and a characteristic of the received signal.

29 Claims, 6 Drawing Sheets

APPARATUS AND METHODS FOR DETECTION OF INTERFACE IN RADIO-FREQUENCY DEVICES

CROSS-REFERENCE TO RELATED APPLICATIONS

This application claims priority to, and incorporates by reference U.S. Provisional Patent Application Ser. No. 61/060,303, filed on Jun. 10, 2008, titled "A Method on Out-of-Band Strong Radar Rejection for Super-Heterodyne RF,".

TECHNICAL FIELD

The disclosed concepts relate generally to communication apparatus and associated methods. More particularly, the disclosed concepts relate to apparatus for and associated methods for detecting and handling interference in communication apparatus and systems.

BACKGROUND

In general, there is a demand for communication systems that can accommodate an ever increasing amount of information and data transfer. Accordingly, to support such information and data transfer, communication networks of considerable complexity have become commonplace.

The complexity of the communication networks has further resulted in the widespread use of wireless communication systems and apparatus. By using radio frequency (RF) signals, wireless communication systems and apparatus can provide connectivity to a relatively large number of users and equipment without the use of wires and fibers. As a result, wireless communication networks have become ubiquitous.

SUMMARY

One aspect of the disclosed concepts concerns the disclosed concepts apparatus and related methods for proper detection and handling of out-of-band radar signals in communication apparatus and systems that include RF apparatus. In one exemplary embodiment, a communication apparatus includes an RF apparatus. The RF apparatus includes an amplifier, and a signal detection circuit. The amplifier receives RF signals and amplifies those signals. The amplifier has an adjustable gain value. The signal detection circuit detects whether a received signal is an out-of-band radar signal depending on the gain value of the amplifier and a characteristic of the received signal.

In another exemplary embodiment, an RF receiver includes an antenna, a low noise amplifier (LNA), a received signal strength indicator (RSSI) circuit, and an out-of-band signal detector. The antenna receives an RF signal. The LNA has selectable first and second gain values. The LNA generates an amplified signal by amplifying the RF signal received by the antenna. The RSSI circuit receives an input signal derived from the amplified signal, and generates a strength indication signal for the input signal. The out-of-band signal detector generates a detection signal based on (i) whether the first gain value or the second gain value of the LNA is selected; and (ii) whether the strength indication signal exceeds a predetermined threshold.

In yet another exemplary embodiment, a method of processing signals in a communication apparatus includes receiving RF signals, and amplifying the RF signals using an adjustable gain value. The method further includes detecting an out-of-band signal based on the gain value and a received signal indicator.

BRIEF DESCRIPTION OF THE DRAWINGS

The appended drawings illustrate only exemplary embodiments and therefore should not be considered as limiting its scope. In the drawings, the same numeral designators used in more than one drawing denote the same, similar, or equivalent functionality, components, or blocks.

DETAILED DESCRIPTION

The disclosed concepts relate generally to communication apparatus and systems and associated methods, specifically to detection and handling of interference in communication apparatus and systems. More specifically, the disclosed concepts provide apparatus and related methods for proper detection and handling of out-of-band radar signals in communication apparatus and systems that include RF apparatus.

Figure 1:
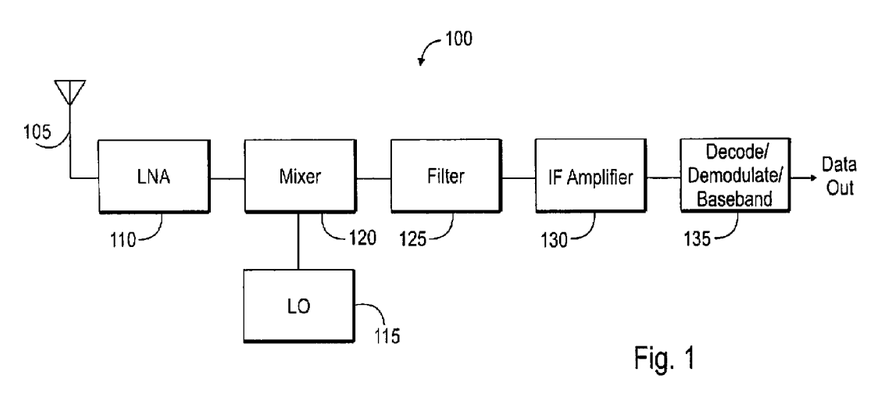
FIG. 1 illustrates a simplified block diagram of a superheterodyne receiver according to an exemplary embodiment.

In some embodiments, the RF apparatus includes a superheterodyne receiver. FIG. 1 illustrates a simplified block diagram of a superheterodyne receiver 100 according to an exemplary embodiment. Superheterodyne receiver 100 includes antenna 105, low noise amplifier (LNA) 110, local oscillator (LO) 115, mixer 120, filter 125, intermediate frequency (IF) amplifier 130, and baseband 135.

Antenna 105 receives RF signals, and provides the RF signals to LNA 110. LNA 110 amplifies the received RF signals, and provides the resulting signals to mixer 120.

LNA 110 has more than one gain value, or an adjustable or programmable gain. In one implementation, LNA 110 has two gain values—a low gain and a high gain. In other implementations, LNA 110 may have more than two gain values.

LO 115 provides a local oscillator signal to mixer 120. Mixer 120 mixes, or multiplies, the amplified RF signals from LNA 110 with the output signal of LO 115. Mixer 120 provides the mixed signals to filter 125.

Filter 125 provides filtering of the signals received from mixer 120. In one implementation, filter 125 reduces the interference or unwanted signals present in the receive path of heterodyne receiver 100.

IF amplifier 130 receives filtered signals form filter 130. IF amplifier 130 amplifies the signal at an IF frequency, and provides the resulting signals to baseband 135.

Baseband 135 includes a variety of circuitry for demodulation, decoding, data processing, etc., as persons of ordinary skill in the art who have the benefit of the description of the disclosed concepts understand. For example, baseband 135 provides the function of mixing the IF signals down to baseband signals. Baseband 135 may also include various filtering and data-processing (e.g., digital signal processing, or DSP), as desired. Baseband 135 outputs processed data or signals (shown as "data out" in FIG. 1).

In addition, and as described in detail below, baseband 135 uses a signal quality indicator, for example, a received signal strength indicator (RSSI) to properly detect and handle out-of-band or out-of-channel radar signals. The process of detecting and handling such signals entails dynamic frequency selection (DFS) based on an RSSI threshold and on the gain of LNA 110, as described below in detail.

Figure 2:
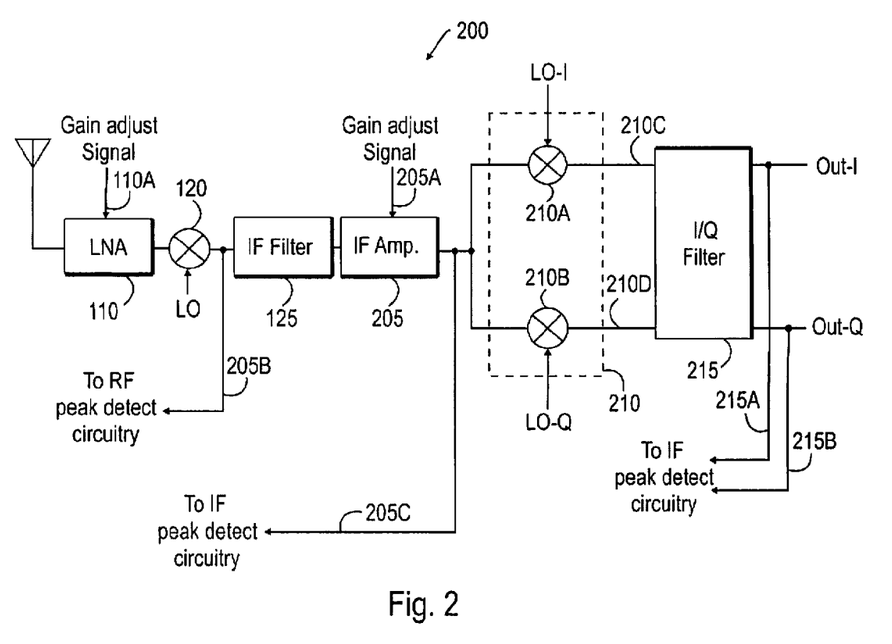
FIG. 2 depicts a simplified block diagram of receive-path circuitry in a superheterodyne receiver according to an exemplary embodiment.

FIG. 2 depicts a simplified block diagram of receive path circuitry 200 in a superheterodyne receiver according to an exemplary embodiment. Thus, in some embodiments, one may use receive path circuitry in heterodyne receiver 100 (see FIG. 1).

Referring to FIG. 2, receive path circuitry 200 includes antenna 105, LNA 110, mixer 120, IF filter 125, IF amplifier 205, complex mixer 210, and complex filter 215. Antenna 105, LNA 110, and mixer 120 may have similar structure and functionality as described above in connection with FIG. 1.

LNA 110 has adjustable, selectable, or programmable gain. More particularly, one may choose a gain for LNA 110 from among a plurality of gain values by adjusting the gain value, selecting a gain value, or programming the gain value. Signal 110A allows the selection, adjustment, or programming of the gain of LNA 110. Signal 110A can be provided from a controller or programmable processor (not shown).

Similar to LNA 110, IF amplifier 205 has adjustable, selectable, or programmable gain.

More specifically, one may choose a gain for IF amplifier 205 from among a plurality of gain values by adjusting the gain value, selecting a gain value, or programming the gain value. Signal 205A allows the selection, adjustment, or programming of the gain of IF amplifier 205. IF amplifier 205 provides an output signal to mixer 210 and to IF peak detect circuitry (signal 205C; see FIG. 3 and associated description).

Complex mixer 210 includes direct mixer 210A, which mixes direct LO signal LO_I with the output signal of IF amplifier 205. Additionally, complex mixer 210 includes quadrature mixer 210B. Quadrature mixer 210B mixes quadrature LO signal LO_Q with the output signal of IF amplifier 205. Thus, complex mixer 210 provides direct and quadrature mixed signals (labeled as 210C and 210D, respectively) to complex filter 215.

Complex filter 215 performs filtering of signals 210C, 210D to provide direct and quadrature filtered signals 215A, 215B, respectively. Complex filter 215 provides signals 215A, 215B to IF peak detect circuitry (see FIG. 3 and associated description).

In some embodiments, filter 215 may constitute a Chebyshev filter. The Chebyshev filter may have a desired or suitable order, for example, sixth order in some embodiments.

Figure 3:
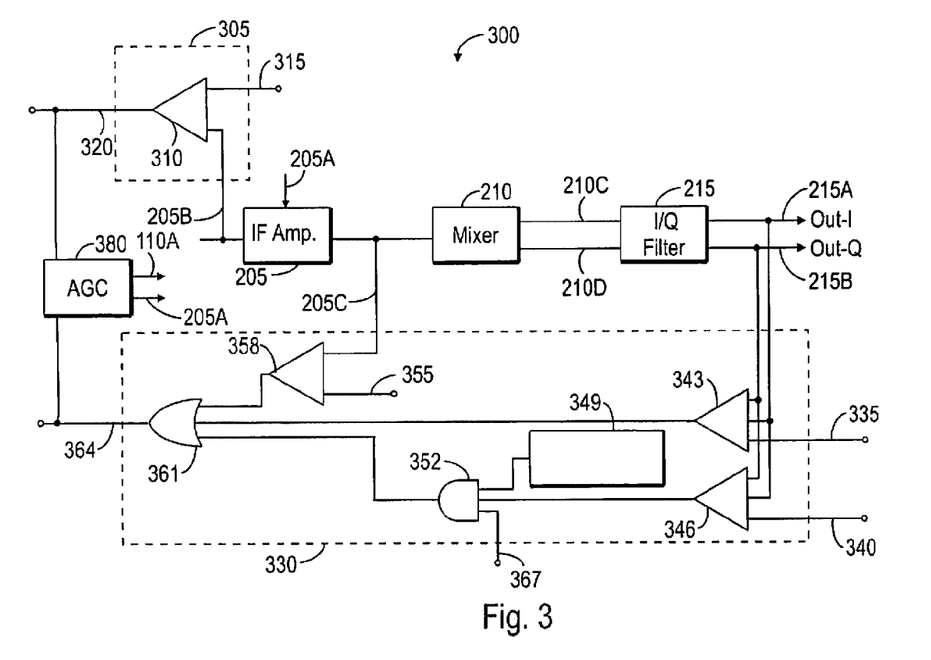
FIG. 3 shows a simplified circuit arrangement of a portion of receive path circuitry and peak detect circuitry according to an exemplary embodiment.

FIG. 3 shows a simplified circuit arrangement 300 of a portion of receive path circuitry and peak detect circuitry according to an exemplary embodiment. Circuit arrangement 300 includes IF amplifier 205, mixer 210, filter 215, RF peak detect circuitry 305, and IF peak detect circuitry 330.

IF amplifier 205, mixer 210, and filter 215 may have similar structure and functionality as described above in connection with FIG. 2. In exemplary embodiments, RF peak detect circuitry 305 constitutes wideband circuitry, whereas IF peak detect circuitry 330 constitutes narrowband circuitry.

RF peak detect circuitry 305 includes peak detector 310, which accepts programmable threshold 315. RF peak detect circuitry 305 detects whether the LNA 110 should be set to low gain (or lower gain) mode. RF signal 205B is rectified and low passed and compared to threshold 315. If the RF signal 205B exceeds threshold 315, RF peak detect signal 320 is asserted high, and is provided to automatic gain controller (AGC) 380. Automatic gain controller 380 will assert gain adjust signal 110A to set LNA 110 to low gain (or to a lower gain) mode to avoid saturation of the output of LNA 110. Since the RF signal 205B is a wide band signal (i.e., from 4.9 GHz to 5.9 GHz), RF peak detect circuitry 305 also behave as a wide band peak detector, and RF peak detect signal 320 indicates LNA 110 saturation due to any strong RF signal (i.e., from 4.9 GHz to 5.9 GHz frequency). Therefore, RF peak detect signal 320 is a wide band (i.e., 1 GHz bandwidth) peak detector.

IF peak detect circuitry 330 includes three peak detectors 358, 343, and 346, and three programmable thresholds 355, 335, and 340, respectively. IF peak detect circuitry 330 detects whether the IF amplifier 205 should reduce the amplifier gain by one step. IF peak detect circuitry 330 operates as follows:

1) If the output of IF amplifier 205 exceeds threshold 355, IF peak detect circuitry 330 indicates that the input 205C to the mixer 210 and the mixer output 210C and 210D to I/Q filter 215 would exceed its maximum stop-band input limit without causing severe distortion in the I/Q filter 215.

2) If the output of the I/Q filter 215 on either the I channel 215A or Q channel 215B exceeds threshold 340 and IF amplifier 205 gain is higher than the normal IF gain 349, IF peak detect circuitry 330 indicates that IF amplifier output 205C has exceeded the high sensitivity threshold, and should be detectable even with a reduced IF amplifier 205 gain setting. In this case the IF amplifier (205) gain should be lowered by one step.

3) If the output of the I/Q filter 215 on either the I or Q channel exceeds threshold 335, IF peak detect circuitry 330 indicates that the input 205C to mixer 210 is so high that at the current IF amplifier gain setting the input 210C and 210D to I/Q filter 215 would exceed its signal limit (i.e., the maximum pass-band input to the I/Q filter 215 without causing severe distortion). In this case, IF peak detect signal 364 should be asserted and passed to Automatic Gain Controller 380 to assert gain adjust signal 205A to IF amplifier 205 to reduce the gain by one step.

One input of Automatic Gain Controller 380 is RF peak detect signal 320, which is generated by RF peak detect circuitry 305. Another input of Automatic Gain Controller 380 is IF peak detect signal 364, which is generated by IF peak detect circuitry. When RF peak detect signal 320 is asserted, Automatic Gain Controller 380 will assert gain adjust signal 110A to set LNA 100 to low gain (or to a lower gain) mode. When IF peak detect signal 364 is asserted, Automatic Gain Controller 380 will assert gain adjust signal 205A to reduce the gain of IF amplifier 205 by one step. Automatic Gain Controller 380 will wait for the IF amplifier 205 to settle to the new gain value (for example, Automatic Gain Controller 380 might wait 200 nanoseconds), and then checks whether IF peak detect signal 364 is still asserted, and will instruct the IF amplifier 205 to lower the gain one step at a time, until either the gain of IF amplifier 205 reaches the minimum gain value, or IF peak detect signal 364 is not asserted anymore.

As noted above, exemplary embodiments of communication apparatus according to the disclosed concepts use various RSSI thresholds, depending on the gain of LNA 110, to detect whether a radar signal constitutes an in-band or out-of-band radar signal. Depending on the results of this determination, the communication apparatus may enable DFS.

In some embodiments, LNA 110 has a bandwidth of 4.9 GHz to 5.9 GHz (e.g., in Wi-Fi applications). Thus, LNA 110 has a sufficiently wide bandwidth so as to pass an out-of-band strong radar signal to the following stages of the RF receiver (see FIGS. 1-3).

More specifically, the out-of-band strong radar signal saturates LNA 110. As a result, RF peak detect circuitry 305 triggers. In response, automatic gain control in the RF receiver responds by switching LNA 110 to the low gain (or to a lower gain) mode.

As a consequence, the RSSI value will increase. The elevation of the RSSI value because of the changing of the gain of LNA 110 is enough to cross the DFS threshold. Crossing the DFS threshold activates DFS detection.

After the change of the gain of LNA 110, the out-of-band strong radar will be attenuated quickly. Filter 125 will further attenuate the out-of-band signal. As a result, the DFS detection will false detect the out-of-band signal as a short pulse (say, with a one microsecond pulse-width), even though the out-of-band radar has a longer pulse width.

Furthermore, the out-of-band radar signal causes ringing and transient effects in filter 125. The ringing and transient effects cause the activation of the peak detect circuitry. As a result, the RF receiver cannot distinguish between in-band and out-of-band radar signals (e.g., by measuring pulse-width). Thus, the out-of-band radar signals may propagate through the RF receiver.

To combat the phenomenon of propagation of out-of-band radar signals through the RF receiver, one may design LNA 110 with a narrower bandwidth. Alternatively, one may use more than one LNA. As yet another alternative, one may use relatively stringent filtering requirements. Doing so, however, would cause more system complexity and, hence, cost.

As another alternative, one may employ a heuristic solution based on the gain of LNA 110 and the RSSI. The heuristic solution allows proper detection and handling of radar signals. In other words, the heuristic solution activates DFS for in-band radar signals, but does not activate (or deactivates) DFS for out-of-band radar signals.

Figure 4:
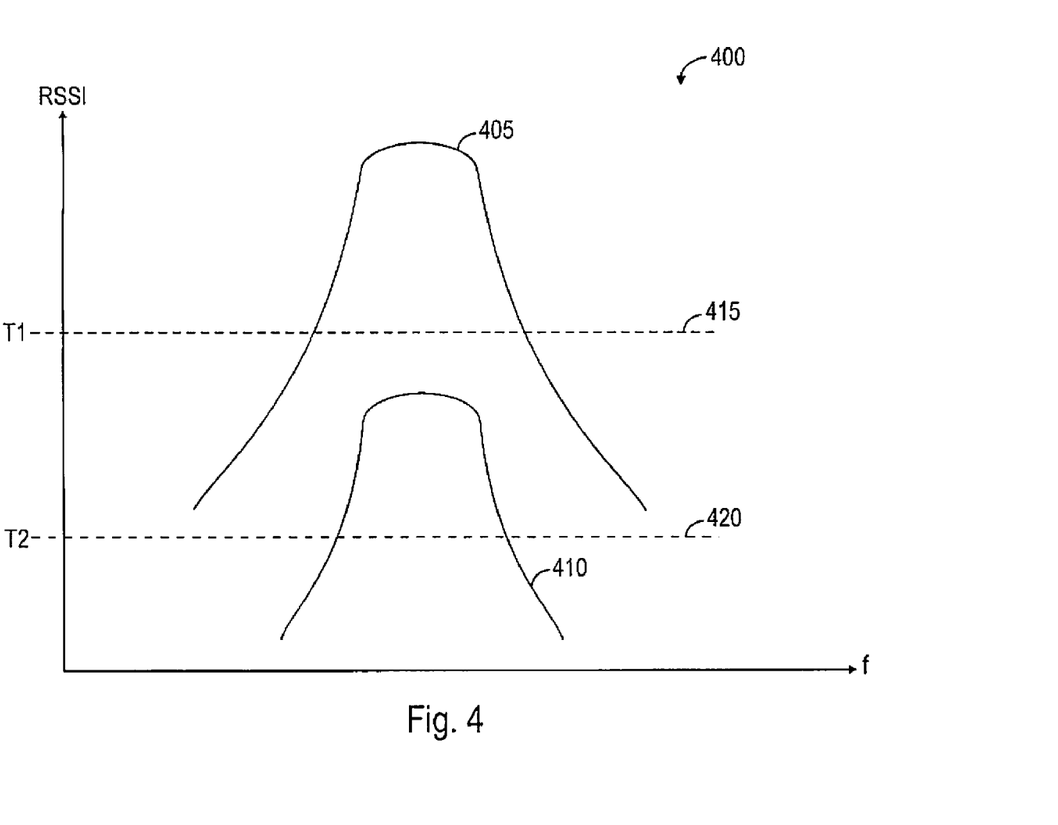
FIG. 4 shows plots of signal strength vs. frequency in exemplary embodiments according to the disclosed concepts.

FIG. 4 shows plots 400 of RSSI vs. frequency in exemplary embodiments that employ the heuristic solution. Specifically, FIG. 4 shows a plot 405 of RSSI as a function of frequency when LNA 110 has a low (or lower) gain value. Furthermore, plot 410 depicts RSSI as a function of frequency when LNA 110 has a high (or higher) gain value. Note that the RSSI is derived from the total gain of the RF receiver. The total gain can be estimated by the Automatic Gain Controller 380. Since the Automatic Gain Controller 380 uses RF peak detect signal 320 and IF peak detect signal 364 to adjust the gain of LNA 110 and IF amplifier 205, the RF peak detector and the IF peak detector should respond, respectively, to wideband signals (i.e., from 4.9 GHz to 5.9 GHz) or narrow band signal (i.e., approximately ±20 MHz from channel center frequency During operation of the RF receiver when LNA 110 has a low (or lower) gain value, one uses RSSI threshold 415 (labeled as "T1"). Specifically, one uses threshold 415 to qualify a received signal as an in-band radar signal.

If RSSI exceeds threshold 415, the signal constitutes an in-band radar signal, thus DFS is activated, and the channel is switched. On the other hand, if RSSI does not exceed threshold 415, the signal constitutes an out-of-band signal, and DFS is not activated.

On the other hand, when LNA 110 has a high gain (or higher) gain value, one uses RSSI threshold 420 (labeled as "T2"), i.e., a normal or nominal threshold. Thus, one uses threshold 420 to qualify a received signal as an in-band radar signal.

If RSSI exceeds threshold 420, the signal constitutes an in-band radar signal, thus DFS is activated, and the channel is switched. On the other hand, if RSSI does not exceed threshold 420, the signal constitutes an out-of-band signal, and DFS is not activated.

Note that threshold 420 has a lower value than does threshold 415. The normal or nominal threshold 420 might have a value specified or prescribed by a communication standard, e.g., the −64 dBm value specified by the IEEE 802.11n standard.

The heuristic solution uses the RSSI thresholds 415 and 420 to properly detect and handle radar signals. More specifically, the heuristic solution uses RSSI thresholds 415 and 420, depending on whether LNA 110 is operating in the low or high gain modes (i.e., with low (or lower) gain values, or high (or higher) gain values) to distinguish between in-band and out-of-band radar signals.

As persons of ordinary skill in the art who have the benefit of the description of the disclosed concepts understand, one may implement the heuristic solution using hardware blocks or circuitry. As an alternative, one may implement the heuristic solution in firmware or software. As yet another alternative, one may implement the heuristic solution using a combination of hardware, firmware, and/or software.

One may use receiver 100 in a variety of applications, as desired. More specifically, one may use receiver 100 in a variety of communication systems.

Figure 5:
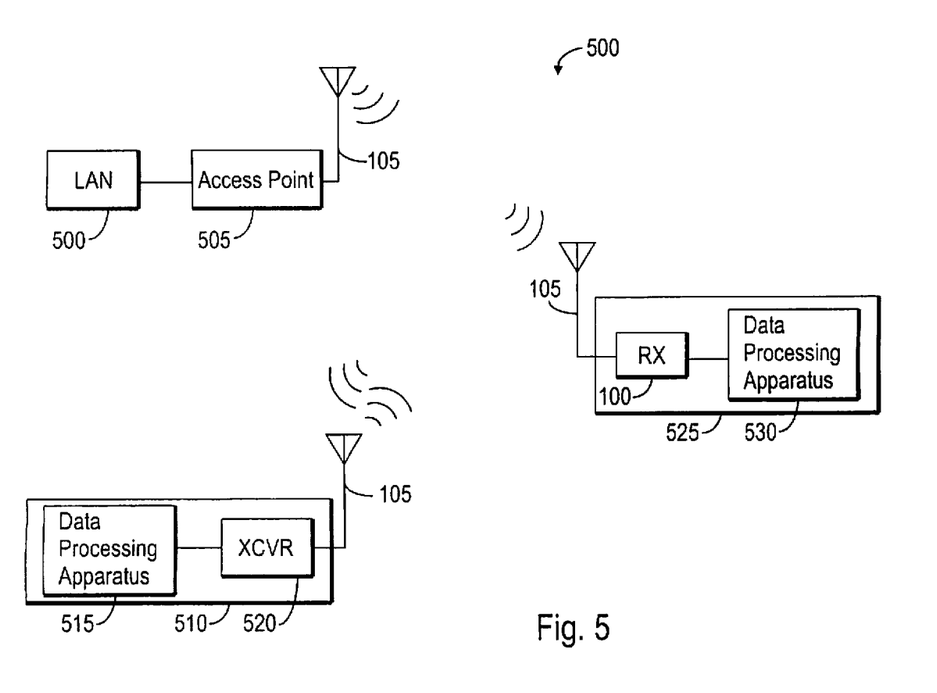
FIG. 5 illustrates a communication system according to an exemplary embodiment.

FIG. 5 illustrates a communication system 500 according to an exemplary embodiment. Note that, generally, communication system 500 may have a variety of forms, as persons of ordinary skill in the art who have the benefit of the description of the disclosed concepts understand. For example, communication system 500 may constitute a wireless LAN, or a system that includes both wireless (e.g., Wi-Fi) and wireline or wired portions. In the embodiment shown, communication system 500 may constitute or include a Wi-Fi network, as exemplified by the IEEE 802.1x standards.

Referring to FIG. 5, communication system 500 includes one or more access points 505. Access point(s) 505 couples to local area network (LAN). Thus, access point(s) 505 exchange data and information with LAN 500. Alternatively, access point(s) 505 may couple to and communicate with one or more wide area network (WAN), and/or one or more virtual network 500, as desired.

Access point(s) 505 also couples to antenna 105. Through antenna 105, access point(s) 505 may receive and transmit RF signals from/to other devices in communication network 500.

Communication system 500 may also include one or more devices or nodes 510. Each device 510 includes antenna 105, transceiver 520, and data processing apparatus 515.

Through antenna 105, device(s) 510 may receive and transmit RF signals from/to other devices in communication network 500. For example, via antenna 105, device(s) 510 may communicate RF signals with access point(s) 505.

Transceiver 520 includes receiver and transmitter circuits (although those circuits may not have individually identifiable blocks of circuits or may use common or shared circuits, as persons of ordinary skill in the art who have the benefit of the description of the disclosed concepts understand). One or more of transceivers 520 includes the circuitry in receiver 100, as described above in detail (i.e., the heuristic solution for proper detection and handling of radar signals).

Data processing apparatus 515 couples to transceiver 520. Data processing apparatus 515 may communicate data and information to transceiver 520 for further communication to other devices in communication system 500.

Data processing apparatus 515 may include a variety of circuits and devices or even systems, as persons of ordinary skill in the art who have the benefit of the description of the disclosed concepts understand. For example, data processing apparatus 515 may include computer circuits or devices. As another example, data processing apparatus 515 may include industrial control or automation equipment.

Note that data processing apparatus 515 may couple to (or include) a variety of communication apparatus, as persons of ordinary skill in the art who have the benefit of the description of the disclosed concepts understand. For example, data processing apparatus 515 may couple to (or include) a wireless LAN, a wired LAN, a combination of the two (a hybrid LAN), or a WAN. As another example, data processing apparatus 515 may couple to (or include) Wi-Fi circuitry. In one embodiment, device(s) 510 include circuitry for multiple input, multiple output (MIMO) communication, for example, as prescribed by the IEEE 802.11n standard.

Communication system 500 may also include one or more devices or nodes 525. Each device 525 includes antenna 105, receiver 100, described above in detail, and data processing apparatus 530.

Through antenna 105, device(s) 525 may receive RF signals from other devices in communication network 500. For example, via antenna 105, device(s) 525 may receiver RF signals from access point(s) 505 and/or from device(s) 510.

Data processing apparatus 530 couples to receiver 100. Data processing apparatus 530 receives data and information from receiver 100.

Data processing apparatus 530 may include a variety of circuits and devices or even systems, as persons of ordinary skill in the art who have the benefit of the description of the disclosed concepts understand. For example, data processing apparatus 530 may include computer circuits or devices. As another example, data processing apparatus 530 may include industrial control or automation equipment.

Note that data processing apparatus 530 may couple to (or include) a variety of communication apparatus—for example, data processing apparatus 530 may couple to (or include) a wireless LAN, a wired LAN, a combination of the two (a hybrid LAN), or a WAN. As another example, data processing apparatus 530 may couple to (or include) Wi-Fi circuitry. In one embodiment, device(s) 530 include circuitry for multiple input, multiple output (MIMO) communication, for example, as prescribed by the IEEE 802.11n standard.

Figure 6:
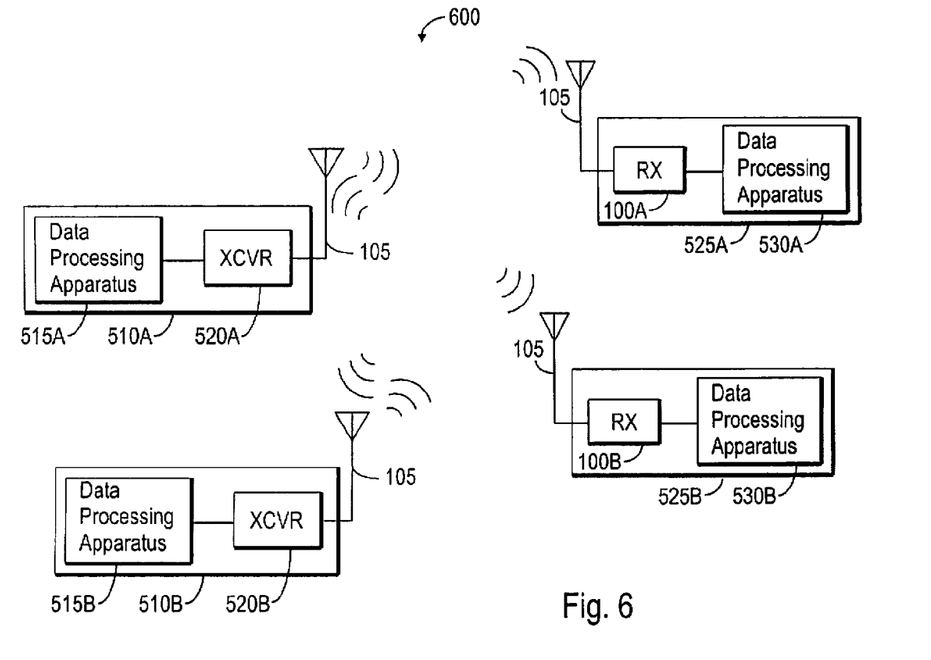
FIG. 6 depicts a communication system according to another exemplary embodiment.

FIG. 6 depicts a communication system 600 according to another exemplary embodiment. Unlike communication system 500 (see FIG. 5), communication system 600 lacks an access point. Thus, the devices in communication system 600 act as peers, e.g., an ad hoc network.

Note that, generally, communication system 600 may have a variety of forms. For example, communication system 600 may constitute a wireless LAN, or a system that includes both wireless (e.g., Wi-Fi) and wireline or wired portions. In the embodiment shown, communication system 600 may constitute or include a Wi-Fi network, as exemplified by the IEEE 802.1x standards.

Referring to FIG. 6, communication system 600 includes one or more devices or nodes, shown as devices 510A-510B and 525A-525B. Devices 510A-510B may have similar structure and operation. Likewise, devices 525A-525B may have similar structure and operation. Accordingly, the following describes device 510A and device 525A.

Device 510A includes antenna 105, transceiver 520A, and data processing apparatus 515A.

Through antenna 105, device 510A may receive and transmit RF signals from/to other devices in communication network 600. For example, via antenna 105, device 510A may communicate RF signals with device 510B or device 525A.

Transceiver 520A includes receiver and transmitter circuits (although those circuits may not have individually identifiable blocks of circuits or may use common or shared circuits). Transceivers 520A includes the circuitry in receiver 100, as described above in detail (i.e., the heuristic solution for proper detection and handling of radar signals).

Data processing apparatus 515A couples to transceiver 520A. Data processing apparatus 515A may communicate data and information to transceiver 520A for further communication to other devices in communication system 600.

Data processing apparatus 515A may include a variety of circuits, devices and/or systems. For example, data processing apparatus 515A may include computer circuits or devices. As another example, data processing apparatus 515A may include industrial control or automation equipment.

Note that data processing apparatus 515A may couple to (or include) a variety of communication apparatus. For example, data processing apparatus 515A may couple to (or include) a wireless LAN, a wired LAN, a combination of the two (a hybrid LAN), or a WAN. As another example, data processing apparatus 515A may couple to (or include) Wi-Fi circuitry. In one embodiment, device 510A includes circuitry for multiple input, multiple output (MIMO) communication, for example, as prescribed by the IEEE 802.11n standard.

Device 525A includes antenna 105, receiver 100A (see FIG. 1), described above in detail, and data processing apparatus 530A.

Through antenna 105, device 525A may receive RF signals from other devices in communication network 600. For example, via antenna 105, device 525A may receiver RF signals from device 510A or device 510B.

Data processing apparatus 530A couples to receiver 100A. Data processing apparatus 530A receives data and information from receiver 100A.

Data processing apparatus 530A may include a variety of circuits, devices and/or systems. For example, data processing apparatus 530A may include computer circuits or devices. As another example, data processing apparatus 530A may include industrial control or automation equipment.

Note that data processing apparatus 530A may couple to (or include) a variety of communication apparatus. For example, data processing apparatus 530A may couple to (or include) a wireless LAN, a wired LAN, a combination of the two (a hybrid LAN), or a WAN. As another example, data processing apparatus 530A may couple to (or include) Wi-Fi circuitry. In one embodiment, device 530A includes circuitry for multiple input, multiple output (MIMO) communication, for example, as prescribed by the IEEE 802.11n standard.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here are possible. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A radio frequency receiver, comprising:
an antenna configured to receive a radio frequency signal;
a first amplifier configured to operate with one of a first gain and a second gain, wherein the first amplifier is configured to amplify the radio frequency signal to generate a first amplified signal;
a first mixer configured to generate an intermediate frequency signal in response to the first amplified signal;
an second amplifier configured to amplify the intermediate frequency signal to generate a second amplified signal;
a received signal strength indicator circuit configured to (i) determine a strength value based on a gain of the radio frequency receiver, and (ii) generate a strength indication signal based on the strength value;
a first detection circuit configured to (i) determine if the second amplified signal is an out-of-band signal, and (ii) generate a first detection signal based on whether the second amplified signal is an out-of-band signal, wherein the first detection circuit is configured to determine the second amplified signal is an out-of-band signal when (i) the first amplifier is operating with the first gain, and (ii) the strength indication signal is less than a first threshold, and wherein the first detection circuit is configured to determine the second amplified signal is an out-of-band signal when (i) the first amplifier is operating with the second gain, and (ii) the strength indication signal is less than a second threshold; and
a controller configured to adjust gain of the second amplifier in response to the first detection signal.

2. The radio frequency receiver of claim 1, wherein the first mixer is configure to multiply the first amplified signal and a first local oscillator signal to generate the intermediate frequency signal.

3. The radio frequency receiver of claim 1, further comprising a mixer circuit connected to the second amplifier, wherein the mixer circuit is configured to multiply the second amplified signal with each of an in-phase local oscillator signal and a quadrature phase local oscillator signal to generate an in-phase output signal and a quadrature phase output signal.

4. The radio frequency receiver of claim 3, further comprising a filter connected to the mixer circuit, wherein the filter is configured to filter the in-phase output signal and the quadrature phase output signal to generate a filtered in-phase output signal and a filtered quadrature phase output signal.

5. The radio frequency receiver of claim 4, wherein:
the first detection circuit is connected to the second amplifier and to the filter; and
the first detection circuit is configured to generate the first detection signal based on (i) the second amplified signal, (ii) the filtered in-phase output signal, and (iii) the filtered quadrature phase output signal.

6. The radio frequency receiver of claim 5, further comprising a second detection circuit connected to the first amplifier, wherein:

the second detection circuit is configured to generate a second detection signal based on the first amplified signal and a third threshold; and
the controller is configured to adjust a gain of the first amplifier based on the second detection signal.

7. The radio frequency receiver of claim 6, wherein:
the first detection circuit comprises is a narrowband peak detector;
the narrowband peak detector is configured to respond to narrowband signals including the second amplified signal;
the second detection circuit comprises a wideband peak detector; and
the wideband peak detector is configured to respond to wideband signals including the first amplified signal.

8. The radio frequency receiver of claim 1, wherein the strength indication signal comprises a received signal strength indication signal.

9. A method of processing signals in a communication apparatus, the method comprising:
receiving a radio frequency signal via an antenna;
amplifying the radio frequency signal to generate a first amplified signal based on one of a first gain and a second gain via a first amplifier;
generating an intermediate frequency signal in response to the first amplified signal;
amplifying the intermediate frequency signal to generate a second amplified signal via a second amplifier;
determining a strength value based on a gain of the apparatus;
generating a strength indication signal based on the strength value;
determining if the second amplified signal is an out-of-band signal comprising
determining the second amplified signal is an out-of-band signal when (i) the first amplifier is operating with the first gain, and (ii) the strength indication signal is less than a first threshold, and
determining the second amplified signal is an out-of-band signal when (i) the first amplifier is operating with the second gain, and (ii) the strength indication signal is less than a second threshold;
generating a first detection signal based on whether the second amplified signal is an out-of-band signal; and
adjusting gain of the second amplifier in response to the first detection signal.

10. The method according to claim 9, wherein the strength indication signal comprises a received signal strength indicator signal.

11. The method according to claim 9, wherein the communication apparatus comprises a Wi-Fi apparatus.

12. The method according to claim 9, wherein the communication apparatus comprises a superheterodyne receiver.

13. The method according to claim 9, wherein the communication apparatus comprises a multiple input multiple output apparatus.

14. The radio frequency receiver according to claim 1, wherein:
the first detection circuit is configured to determine the second amplified signal is an in-band signal when (i) the first amplifier is operating with the first gain, and (ii) the strength indication signal is greater than the first threshold; and
the first detection circuit is configured to determine the second amplified signal is an in-band signal when (i) the first amplifier is operating with the second gain, and (ii) the strength indication signal is greater than the second threshold.

15. The radio frequency receiver according to claim 1, further comprising a second detection circuit configured to (i) determine whether the radio frequency signal is greater than a third threshold, and (ii) generate a second detection signal to adjust a gain of the first amplifier when the radio frequency signal is greater than the third threshold.

16. The radio frequency receiver according to claim 1, wherein the first detection circuit is configured to determine whether to decrease a gain of the second amplifier based on whether:
   the second amplified signal is greater than a third threshold; and
   an in-phase output signal or a quadrature output signal is greater than a fourth threshold, wherein the in-phase output signal and the quadrature output signal are generated based on the second amplified signal.

17. The radio frequency receiver according to claim 16, wherein the first detection circuit is configured to determine whether to decrease a gain of the second amplifier based on whether the gain of the second amplifier is greater than a predetermined gain.

18. The radio frequency receiver according to claim 16, further comprising a second detection circuit configured to determine whether to decrease a gain of the first amplifier based on whether the first amplified signal is greater than a fifth threshold.

19. The radio frequency receiver according to claim 1, wherein the first detection circuit comprises:
   a first comparator configured to (i) compare the second amplified signal to a third threshold, and (ii) generate a first comparison signal;
   a second comparator configured to (i) compare an in-phase output signal or a quadrature output signal to a fourth threshold, and (ii) generate a second comparison signal, wherein the in-phase output signal and the quadrature output signal are generated based on the second amplified signal; and
   a first gate configured to generate the first detection signal in response to (i) the first comparison signal, and (ii) the second comparison signal.

20. The radio frequency receiver according to claim 19, wherein the first detection circuit further comprises:
   a third comparator configured to (i) compare the in-phase output signal or the quadrature output signal to a fifth threshold, and (ii) generate a third comparison signal; and
   a second gate configured to generate an output signal (i) in response to the third comparison signal, and (ii) based on whether a gain of the second amplifier is greater than a predetermine gain,
   wherein the first gate is configured to generate the first detection signal in response to the output signal of the second gate.

21. The radio frequency receiver of claim 1, wherein the strength indication signal has a frequency outside a predetermined frequency range when the second amplified signal is an out-of-band signal.

22. The radio frequency receiver of claim 1, wherein the gain of the radio frequency receiver is based on (i) a gain of the first amplifier, and (ii) a gain of the second amplifier.

23. The method according to claim 9, further comprising:
   determining the second amplified signal is an in-band signal when (i) the first amplifier is operating with the first gain, and (ii) the strength indication signal is greater than the first threshold; and
   determining the second amplified signal is an in-band signal when (i) the first amplifier is operating with the second gain, and (ii) the strength indication signal is greater than the second threshold.

24. The method according to claim 9, further comprising:
   determining whether the radio frequency signal is greater than a third threshold; and
   generating a second detection signal to adjust a gain of the first amplifier when the radio frequency signal is greater than the third threshold.

25. The method according to claim 9, further comprising determining whether to decrease a gain of the second amplifier based on whether:
   the second amplified signal is greater than a third threshold; and
   an in-phase output signal or a quadrature output signal is greater than a fourth threshold, wherein the in-phase output signal and the quadrature output signal are generated based on the second amplified signal.

26. The method according to claim 25, further comprising:
   determining whether to decrease a gain of the second amplifier based on whether the gain of the second amplifier is greater than a predetermined gain; and
   determining whether to decrease a gain of the first amplifier based on whether the first amplified signal is greater than a fifth threshold.

27. The method according to claim 9, further comprising:
   via a first comparator, (i) comparing the second amplified signal to a third threshold, and (ii) generating a first comparison signal;
   via a second comparator, (i) comparing an in-phase output signal or a quadrature output signal to a fourth threshold, and (ii) generating a second comparison signal, wherein the in-phase output signal and the quadrature output signal are generated based on the second amplified signal; and
   via a first gate, generating the first detection signal in response to (i) the first comparison signal, and (ii) the second comparison signal.

28. The method according to claim 27, further comprising:
   via a third comparator, (i) comparing the in-phase output signal or the quadrature output signal to a fifth threshold, and (ii) generating a third comparison signal;
   via a second gate, generating an output signal (i) in response to the third comparison signal, and (ii) based on whether a gain of the second amplifier is greater than a predetermine gain; and
   via the first gate, generating the first detection signal in response to the output signal of the second gate.

29. The method according to claim 9, further comprising, when the strength indication signal is greater than one of the first threshold and the second threshold:
   activating dynamic frequency selection; and
   switching a channel of the apparatus.

* * * * *